(12) United States Patent
Sekine et al.

(10) Patent No.: US 7,397,668 B2
(45) Date of Patent: Jul. 8, 2008

(54) SIGNAL INPUT/OUTPUT DEVICE

(75) Inventors: Mitsuo Sekine, Kasukabe (JP); Yutaka Noguchi, Chigasaki (JP); Makoto Seo, Moriya (JP)

(73) Assignee: SMC Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/561,020

(22) Filed: Nov. 17, 2006

(65) Prior Publication Data

US 2007/0133150 A1 Jun. 14, 2007

(30) Foreign Application Priority Data

Dec. 12, 2005 (JP) .............................. 2005-357571

(51) Int. Cl.
H05K 5/00 (2006.01)
H05K 7/00 (2006.01)
H01R 9/22 (2006.01)

(52) U.S. Cl. ........................ 361/732; 361/728; 439/717; 439/715

(58) Field of Classification Search ................. 361/679, 361/728, 732; 710/71; 137/884, 269; 439/715, 439/717
See application file for complete search history.

(56) References Cited

U.S. PATENT DOCUMENTS

| 5,699,830 | A | * | 12/1997 | Hayashi et al. | ............. 137/554 |
| 5,883,785 | A | * | 3/1999 | Rohrbeck et al. | ............ 361/731 |
| 5,915,666 | A | * | 6/1999 | Hayashi et al. | ........ 251/129.01 |
| 5,918,629 | A | * | 7/1999 | Hayashi et al. | ............. 137/560 |
| 6,081,419 | A | * | 6/2000 | Pham | ........................ 361/617 |
| 6,173,745 | B1 | * | 1/2001 | Hayashi et al. | ............. 137/884 |
| 6,206,045 | B1 | * | 3/2001 | Hayashi et al. | ............. 137/884 |
| 6,475,036 | B2 | * | 11/2002 | Morikawa | .................... 439/716 |
| 6,634,910 | B2 | * | 10/2003 | Lieb et al. | .................... 439/715 |
| 6,704,815 | B1 | * | 3/2004 | Morikawa et al. | ............. 710/71 |
| 6,848,933 | B1 | * | 2/2005 | Delaney et al. | ............. 439/392 |
| 6,916,194 | B2 | * | 7/2005 | Sichner et al. | .............. 439/271 |
| 7,142,434 | B2 | * | 11/2006 | Beihoff et al. | .............. 361/818 |
| 7,177,153 | B2 | * | 2/2007 | Radosevich et al. | ......... 361/699 |
| 2007/0026739 | A1 | * | 2/2007 | Kim et al. | .................... 439/627 |

FOREIGN PATENT DOCUMENTS

JP 2002-23808 1/2002

* cited by examiner

*Primary Examiner*—Anatoly Vortman
*Assistant Examiner*—Bradley H Thomas
(74) *Attorney, Agent, or Firm*—Paul A. Guss

(57) ABSTRACT

A signal input/output device includes an array of signal input/output units. The signal input/output units have respective bases, each of which includes a connecting member. The connecting member has a second protruding end finger swingably supported on a base, and a first protruding end finger that engages with a stop of an adjacent base. The connecting member is positioned and fixed (secured) by a screw, which extends through a bottom plate and is threaded in a square nut. The connecting member, when secured in this manner, joins the adjacent bases to each other.

17 Claims, 7 Drawing Sheets

SIGNAL INPUT/OUTPUT DEVICE

BACKGROUND OF THE INVENTION

1. Field of the Invention

The present invention relates to a signal input/output device for receiving an electric signal transmitted from a sensor, a switch, or the like, and for sending an electric signal to a solenoid-operated valve manifold or the like.

2. Description of the Related Art

Signal input/output devices receive control signals generated by a controller, for example, and also transmit control signals for opening or closing a valve or for energizing an external load such as a lamp, a relay, or the like, based on the received control signals. Signal input/output devices also receive signals transmitted from a sensor, a switch, or the like that is mounted on a cylinder, and transfer the signals to a controller.

A signal input/output device of the above type is disclosed in Japanese Laid-Open Patent Publication No. 2002-23808. The disclosed signal input/output device includes a plurality of juxtaposed signal input/output units, wherein adjacent signal input/output units are connected to each other by a pin mounted on an end face of one of the signal input/output units, which engages in a hole defined in the other signal input/output unit (see paragraph "0015" of this publication).

However, the strength with which such adjacent signal input/output units are joined to each other by engagement of the pin within the hole is not very large. To increase the joining strength, the hole may be filled with an adhesive, so that the pin inserted in the hole can be held firmly in place by the adhesive. However, once the pin is fixed in position by the adhesive, it is difficult to separate adjacent signal input/output units, for the purpose of increasing or reducing the number of signal input/output units that are used.

SUMMARY OF THE INVENTION

It is a general object of the present invention to provide a signal input/output device comprising a plurality of signal input/output units, which are joined together with increased strength.

A major object of the present invention is to provide a signal input/output device comprising a plurality of joined signal input/output units, which can easily be separated.

According to the present invention, a signal input/output device is provided, comprising an array of signal input/output units, each of said signal input/output units including a base having a connector, and an electric signal input/output module disposed on the base. The base includes a connecting member swingably supported on one end thereof and a stop disposed at an opposite end thereof for engaging a connecting member of another base that is disposed adjacent to the base. Adjacent signal input/output units are joined to each other by the connecting member of the base, which engages in a stop of the other base that is disposed adjacent to the base.

According to the present invention, adjacent signal input/output units are joined to each other by means of the swingable connecting member. This arrangement allows the signal input/output units to be joined together with an increased joining strength.

No adhesive is required to join the adjacent signal input/output units. Therefore, when the number of signal input/output units is increased or reduced, e.g., when another signal input/output unit is added, or when an unwanted signal input/output unit is removed, the adjacent signal input/output units can be separated quite easily.

The connecting member of each base should preferably be secured to an engaging portion of the base by a fastening member. Once the connecting member has been positioned and fixed by the fastening member, the adjacent signal input/output units can be firmly joined together without separating, enabling the signal input/output device to be assembled with increased joining strength.

An end block, which is disposed adjacent to the signal input/output unit at one end of the array, should also preferably have a connecting member swingably supported on an end of the end block facing the signal input/output unit, whereby the connecting member engages with the stop of the signal input/output unit. In other words, the end block should preferably be joined to the signal input/output unit at the end of the array, in the same manner as the mutually adjacent signal input/output units that are joined to each other. Therefore, the signal input/output unit at the end of the array and the end block are joined to each other with an increased joining strength.

The electric signal input/output modules should preferably have insertion holes for enabling insertion of tag plates therein. For example, tag plates carrying descriptions of functions of the electric signal input/output modules are inserted into the respective insertion holes. Such tag plates and corresponding descriptions are effective to prevent a worker from incorrectly connecting cables to the electric signal input/output modules.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

A signal input/output device according to a preferred embodiment of the present invention shall be described in detail below with reference to the accompanying drawings.

Figure 1:
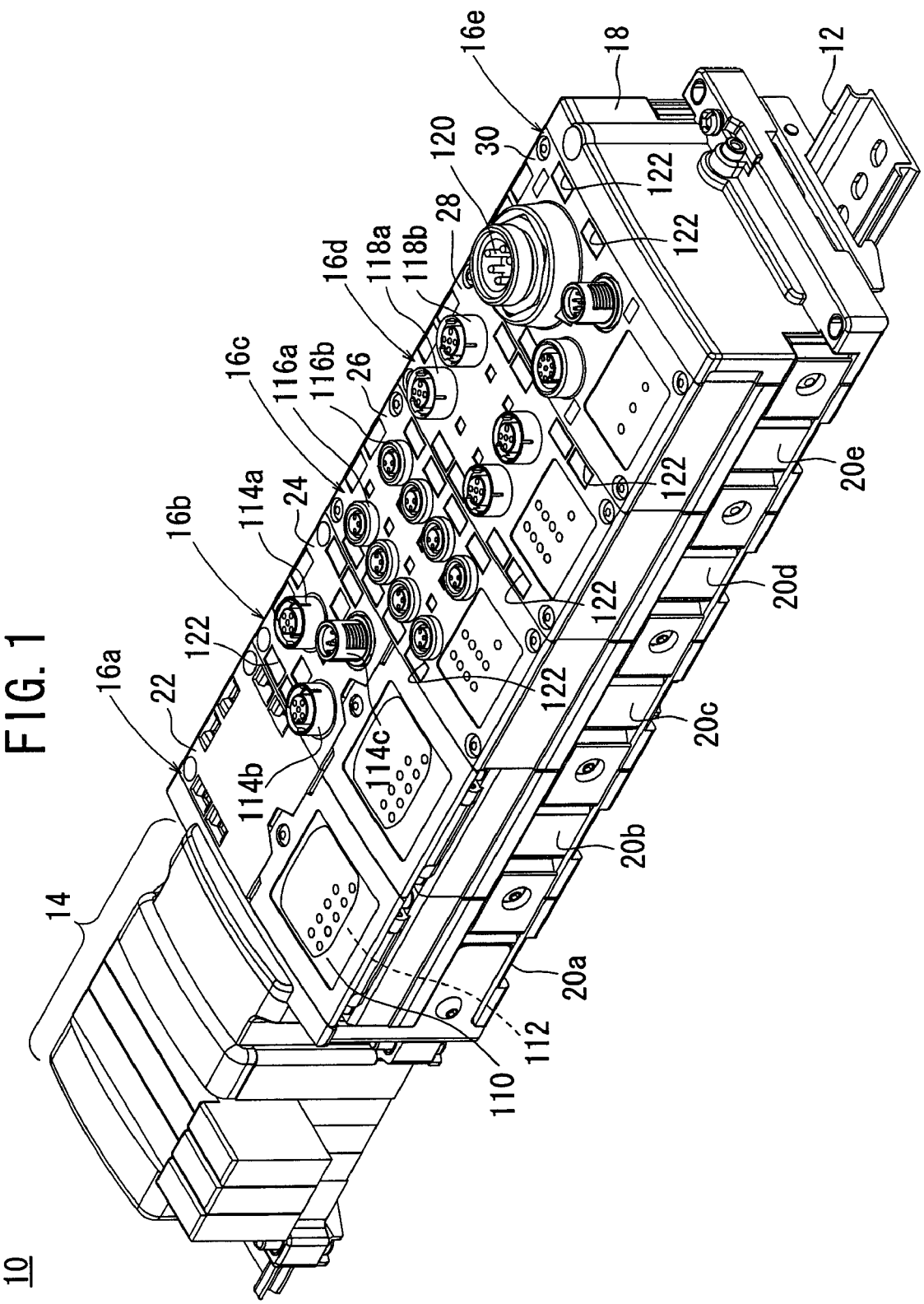
FIG. 1 is a perspective view of a signal input/output device according to an embodiment of the present invention.

FIG. 1 shows a perspective view of a signal input/output device 10 according to the embodiment of the present invention. The signal input/output device 10 is disposed slidably on an elongate guide rail 12.

The signal input/output device 10 includes a valve manifold 14, an array of juxtaposed signal input/output units 16a through 16e with an end thereof joined to the valve manifold 14, and an end block 18 positioned at the other end of the array. The signal input/output unit 16b functions as a relay unit, for transmitting signals to a controller, e.g., a programmable controller (not shown).

The signal input/output units 16a through 16e comprise respective signal input/output modules disposed respectively on bases 20a through 20e. Specifically, the signal input/output modules of the signal input/output units 16a through 16e include, respectively, a switching module 22, a communication module 24, an input module 26, an output module 28, and a power supply module 30.

The base 20b, which makes up one of the bases 20a through 20e, shall be described in detail below.

Figure 2:
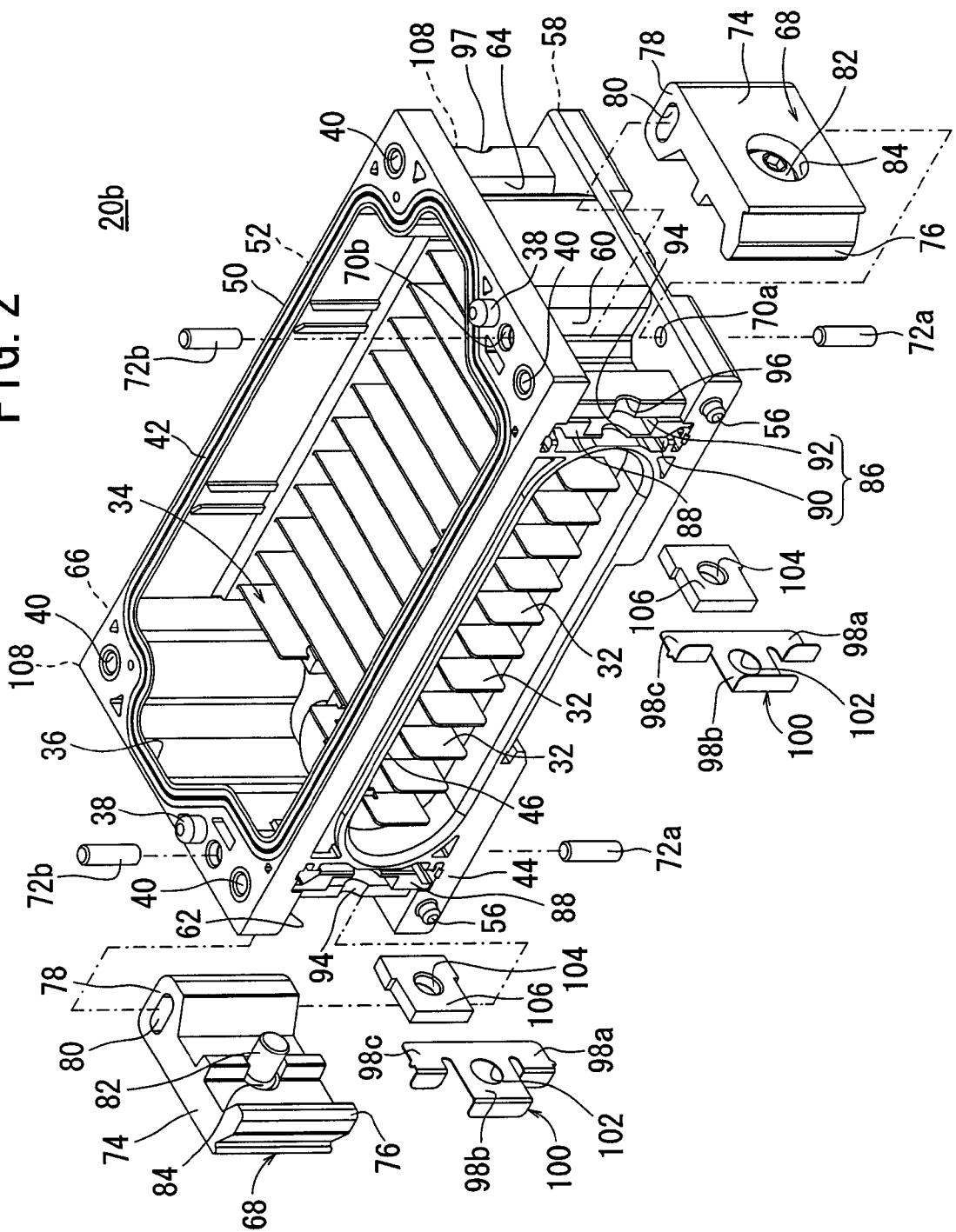
FIG. 2 is a perspective view of a base of a signal input/output unit of the signal input/output device shown in FIG. 1.
Figure 3:
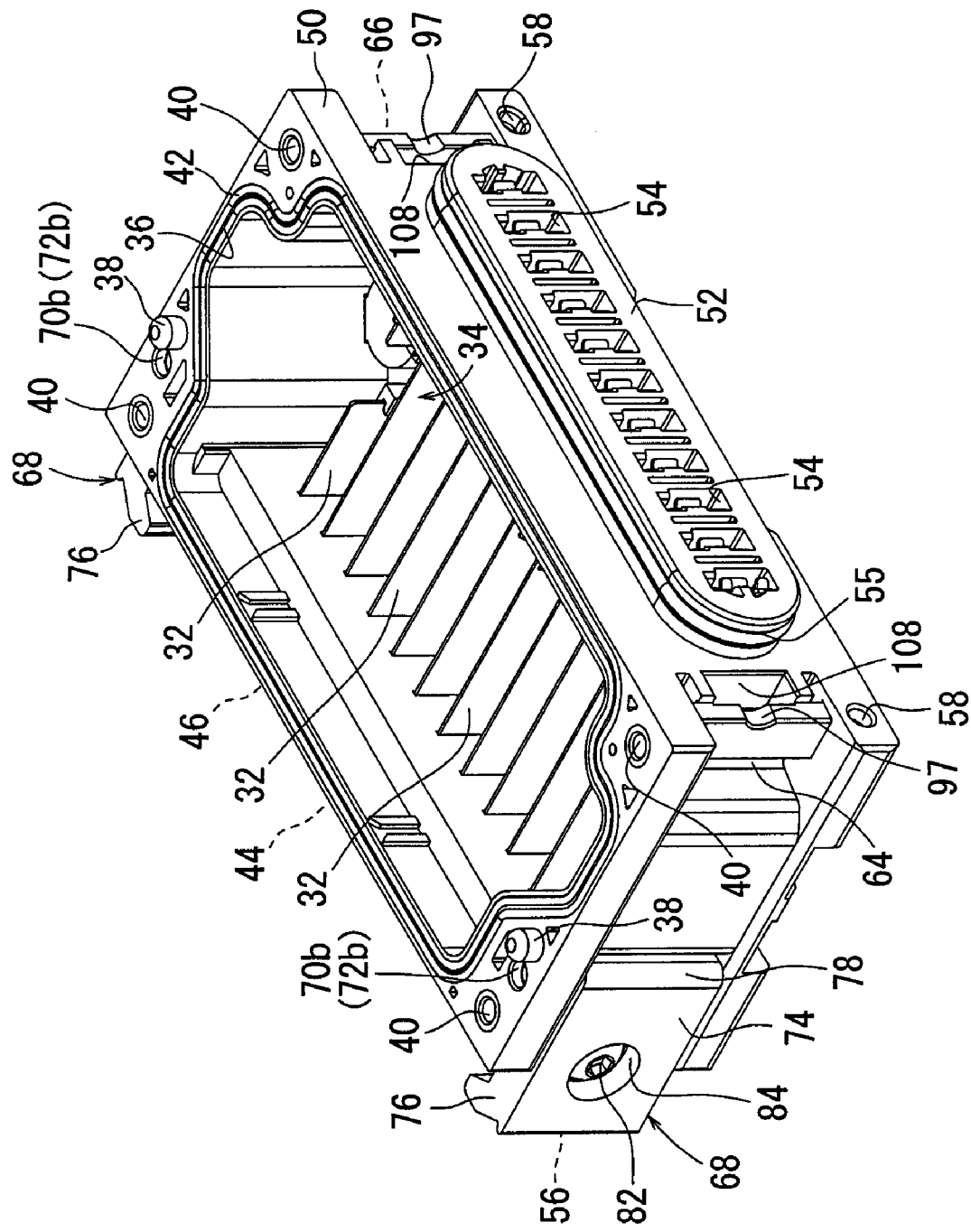
FIG. 3 is a perspective view of the base shown in FIG. 2, which illustrates the base as viewed from another direction.

As shown in FIGS. 2 and 3, the base 20b comprises a housing substantially in the form of a rectangular parallelepiped, accommodating therein a connector 34 having a plurality of terminal plates 32 shaped as fins. Each of the terminal plates 32 has a longitudinal direction extending perpendicularly to the longitudinal direction of the base 20b. The base 20b has an opening 36 defined in an upper panel thereof. The connector 34 is electrically connected to the communication module 24, which is mounted on the upper panel of the base 20b.

The communication module 24, which is mounted on the base 20b, is positioned and fixed thereto by first engaging pins 38 that project from the upper panel of the base 20b, and first pin engaging holes 40 defined in the top panel of the base 20b. The communication module 24 has second pin engaging holes (not shown) defined in a lower panel thereof in alignment with the first engaging pins 38, together with second engaging pins (not shown) which project on the lower panel thereof in alignment with the first pin engaging holes 40. When the communication module 24 is placed on the base 20b, the first engaging pins 38 of the base 20b are fitted respectively into the second pin engaging holes of the communication module 24, whereas the second engaging pins of the communication module 24 are fitted respectively into the first pin engaging holes 40 of the base 20b, thereby positioning and fixing the communication module 24 onto the base 20b. A seal member 42 is disposed on the upper panel of the base 20b, around the opening 36 thereof, in order to provide a seal between the base 20b and the communication module 24.

The base 20b also includes a longitudinal side panel 44 facing the base 20a and having an oblong hole 46 defined therein (see FIG. 2). Ends of the terminal plates 32 are exposed in the oblong holes 46.

The base 20b has an opposite longitudinal side panel 50 facing the base 20c and supporting an elliptical terminal connector 52 (see FIG. 3), which is positioned in symmetrical relation to the oblong hole 46. The terminal connector 52 has insertion holes 54 defined therein, wherein the terminal plates 32 of the base 20c that is positioned adjacent to the base 20b are inserted into the insertion holes 54. An elliptical seal member 55 is mounted on an outer circumferential wall of the terminal connector 52.

Third engaging pins 56 project from the longitudinal side panel 44 of the base 20b, and third pin engaging holes 58 are defined in the other longitudinal side panel 50 of the base 20b. The third engaging pins 56 are fitted respectively into third pin engaging holes, which are similar to the third pin engaging holes 58, and are defined in a longitudinal side panel of the adjacent base 20a. Third engaging pins, similar to the third engaging pins 56, and projecting from a longitudinal side panel of the adjacent base 20c, are fitted respectively into the third pin engaging holes 58.

The base 20b also has a first recess 60 and a second recess 62, which are defined therein near opposite corners of the longitudinal side panel 44. Similarly, the base 20b also has a third recess 64 and a fourth recess 66, which are defined therein near opposite corners of the longitudinal side panel 50.

Connecting members 68 are provided, having respective ends thereof positioned and secured in the first recess 60 and the second recess 62, respectively. The first recess 60, along with the connecting member 68 which is positioned and secured therein, shall be described by way of example below. The upper and lower panels of the base 20b include respective shaft holes 70a, 70b defined therein proximate the first recess 60. The connecting member 68 is swingably supported by swing shafts 72a, 72b, which are inserted respectively into the shaft holes 70a, 70b.

Specifically, the connecting member 68 is of a substantially concave shape, having an elongate bottom plate 74 with a first protruding end finger 76 and a second protruding end finger 78, which project at respective angles from respective opposite ends of the bottom plate 74. The second protruding end finger 78 has a shaft insertion hole 80 defined therein. The swing shafts 72a, 72b are inserted respectively through the shaft holes 70a, 70b in the base 20b, and into the shaft insertion hole 80 provided in the second protruding end finger 78, so that the connecting member 68 is swingably supported in the first recess 60 for enabling swinging movement about the swing shafts 72a, 72b. The height of the second protruding end finger 78 is of a dimension that allows the second protruding end finger 78 to be inserted into the clearance between the upper and lower panels of the base 20b. The bottom plate 74 of the connecting member 68 has a screw insertion hole 84 defined substantially centrally therein, with a screw 82 (fastening member) being inserted into the screw insertion hole 84.

Insertion grooves 86 are defined in the longitudinal side panel 44 of the base 20b, respectively near longitudinally opposite ends of the oblong hole 46. A thin-walled grip 88 is disposed in each of the insertion grooves 86, thereby dividing the insertion groove 86 into a first slot 90 and a second slot 92. The thin-walled grip 88 has an arcuate recess 94 defined in an exposed edge thereof, and the corner of the longitudinal side panel 44 also has an arcuate recess 96 defined in a side edge thereof. The corner of the longitudinal side panel 50 also has an arcuate recess 97 defined in a side edge thereof.

A leaf spring 100 is inserted into the first slot 90. The leaf spring 100 has a vertically extending base portion along with a first protrusion 98a, a second protrusion 98b, and a third protrusion 98c, which extend horizontally from a lower end portion, a middle portion, and an upper end portion, respectively, of the base portion. The second protrusion 98b is longer than the first and third protrusions 98a, 98c. The first protrusion 98a, the second protrusion 98b, and the third protrusion 98c have respective distal ends, which are bent substantially perpendicularly toward the second slot 92. The second protrusion 98b has a screw insertion hole 102 defined substantially centrally therein, which has a diameter large enough to receive the tip end of the screw 82.

A square nut 106 is inserted in the second slot 92. The square nut 106 has steps provided respectively on its upper and lower end faces, and an internally threaded hole 104 defined substantially centrally therein. The square nut 106 is held against the leaf spring 100, such that the internally threaded hole 104 is positioned in alignment with the screw insertion hole 102 of the leaf spring 100, the lateral distal end of the square nut 106 is blocked by the bent distal end of the second protrusion 98b of the leaf spring 100, and the steps on the upper and lower end faces of the square nut 106 are blocked respectively by the bent distal ends of the first and third protrusions 98a, 98c of the leaf spring 100. Thus, the square nut 106 is prevented from being removed from the second slot 92 by the leaf spring 100.

As described later, the connecting member 68 becomes positioned and fixed when the screw 82, which is inserted through the screw insertion hole 84, is threaded into the internally threaded hole 104 of the square nut 106. The square nut 106, which is inserted in the second slot 92 and hence is mounted in the base 20b, serves as a retainer for holding the connecting member 68 securely in position. The diameter of the screw insertion hole 84 is smaller than the diameter of the head of the screw 82, so that the head of the screw 82 is blocked from entering into the screw insertion hole 84. As described later, the screw 82 is threaded into the internally threaded hole 104 only after the first protruding end finger 76 of the connecting member 68 has engaged within the first recess of the base 20a.

The portion of the longitudinal side panel 44 proximate the second recess 62 is constructed in the same manner as the portion of the longitudinal side panel 44 proximate the first recess 60. Therefore, identical parts, which make up the portion of the longitudinal side panel 44 proximate the second recess 62, are denoted by the same reference characters as those referred to above, and shall not be described in detail below. The connecting member 68, the leaf spring 100, and the square nut 106, which are associated with the portion of the longitudinal side panel 44 proximate the second recess 62, also are constructed in the same manner as those associated with the portion of the longitudinal side panel 44 proximate the first recess 60.

Connecting members 68 provided on the base 20c have respective first protruding end fingers 76 inserted respectively into the third and fourth recesses 64, 66 defined in the longitudinal side panel 50, which faces the base 20c (see FIG. 1). The third and fourth recesses 64, 66 serve as stops for engaging the connecting members 68.

The longitudinal side panel 50 has engaging cavities 108 defined therein, near the third and fourth recesses 64, 66, respectively. The leaf spring 100 and the square nut 106 projecting from the base 20c are inserted into each of the engaging cavities 108, as described later.

The other bases 20a, and 20c through 20e are essentially identical in structure to the base 20b. Therefore, identical parts thereof are denoted using the same reference characters as those referred to above, and shall not be described in detail below.

A process of joining respective bases, e.g., the bases 20b and 20c, shall be described below with reference to FIGS. 4 through 7. For illustrative purposes, the communication module 24 and the input module 26, which normally are provided on the bases 20b, 20c, have been omitted from illustration in FIGS. 4 through 7.

Figure 4:
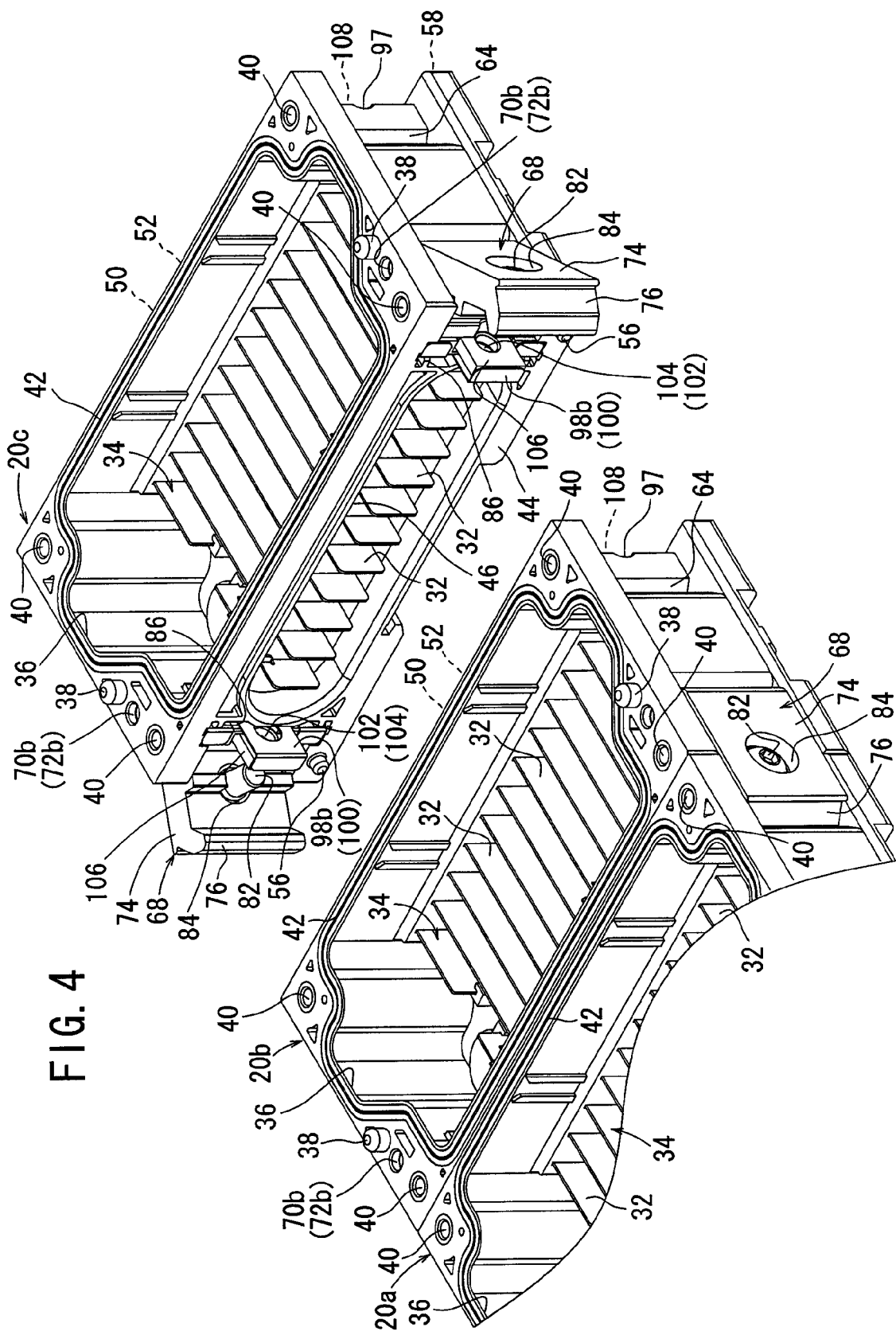
FIG. 4 is a perspective view showing adjacent bases before they are joined to each other.

As shown in FIG. 4, the bases 20b, 20c are relatively positioned such that the leaf spring 100 and the square nut 106 of the base 20c face the longitudinal side panel 50 of the base 20b. The base 20c is guided along the guide rail 12 so as to move toward the base 20b that has been joined to the base 20a, until finally the terminal connector 52 of the base 20c becomes inserted into the oblong hole 46 of the base 20b. At this time, the terminal plates 32 of the base 20c are fitted into the respective insertion holes 54 provided in the terminal connector 52 of the base 20b, whereupon the connector 34 of the base 20b and the connector 34 of the base 20c are electrically connected to each other. As a result, the switching module 22 on the base 20a, the communication module 24 on the base 20b, and the input module 26 on the base 20c are electrically connected to each other. The elliptical seal member 55 is held in intimate contact with an inner circumferential wall surface of the oblong hole 46, thereby sealing the oblong hole 46.

Figure 5:
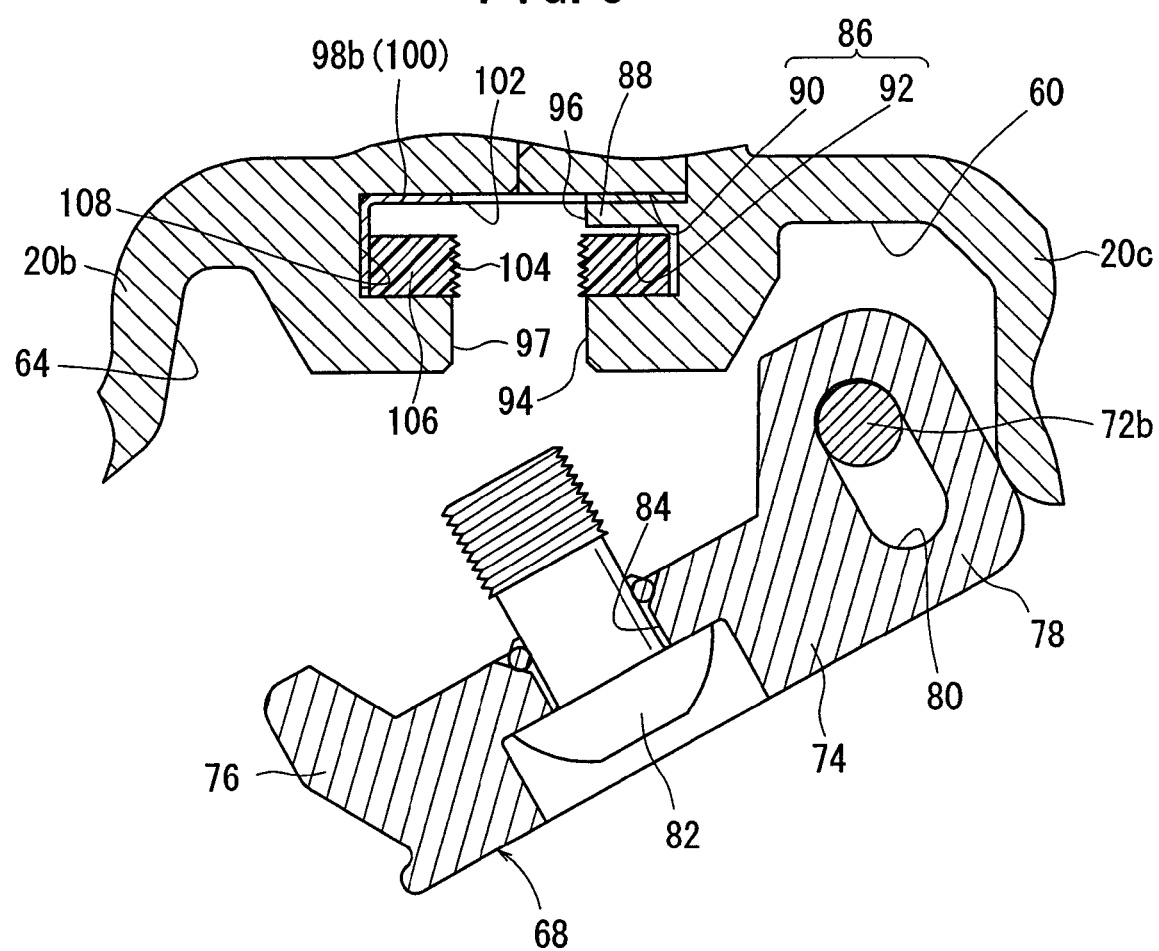
FIG. 5 is an enlarged fragmentary sectional plan view showing the manner in which a leaf spring and a square nut on one of the bases are inserted into an engaging cavity in another base.
Figure 6:
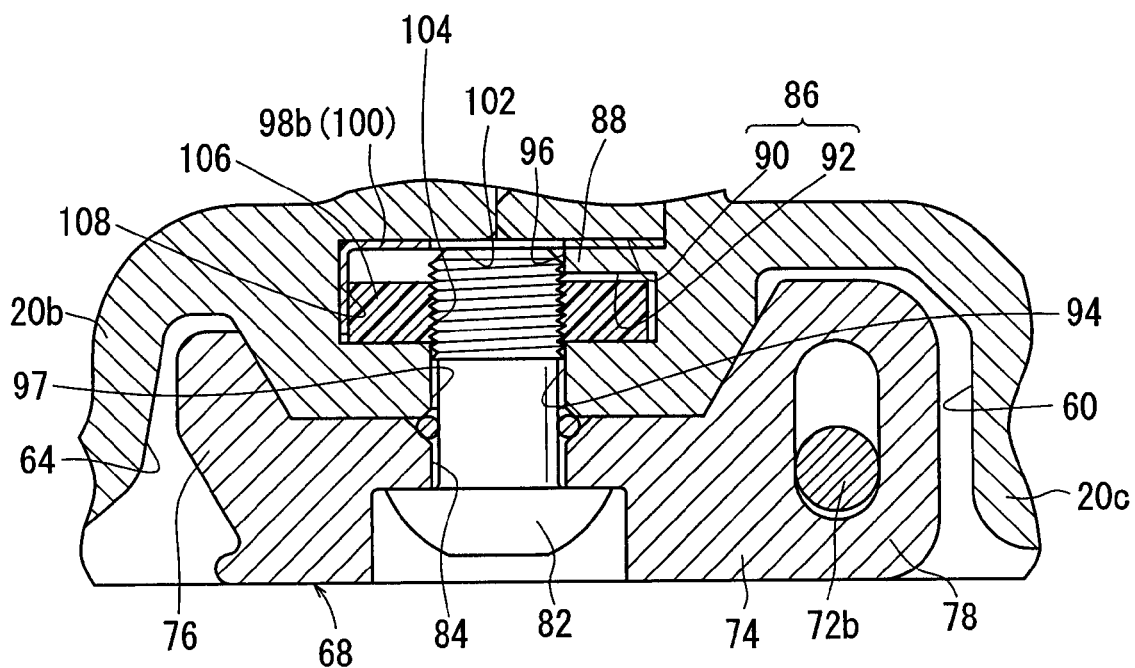
FIG. 6 is an enlarged fragmentary sectional plan view showing the manner in which a connecting member on one of the bases is inserted into recesses in the base.

When the connectors 34 are electrically connected to each other, at the same time, the third engaging pins 56 on the longitudinal side panel 44 of the base 20c engage respectively within the third pin engaging holes 58 of the base 20b. In addition, as shown in FIG. 5, the leaf spring 100 and the square nut 106 on the base 20c are inserted into the engaging cavity 108 of the base 20b. The connecting members 68 on the base 20c are angularly moved about the swing shafts 72a, 72b, until finally the first protruding end fingers 76 of the connecting members 68 are inserted into the third and fourth recesses 64, 66 in the base 20b, as shown in FIG. 6.

Figure 7:
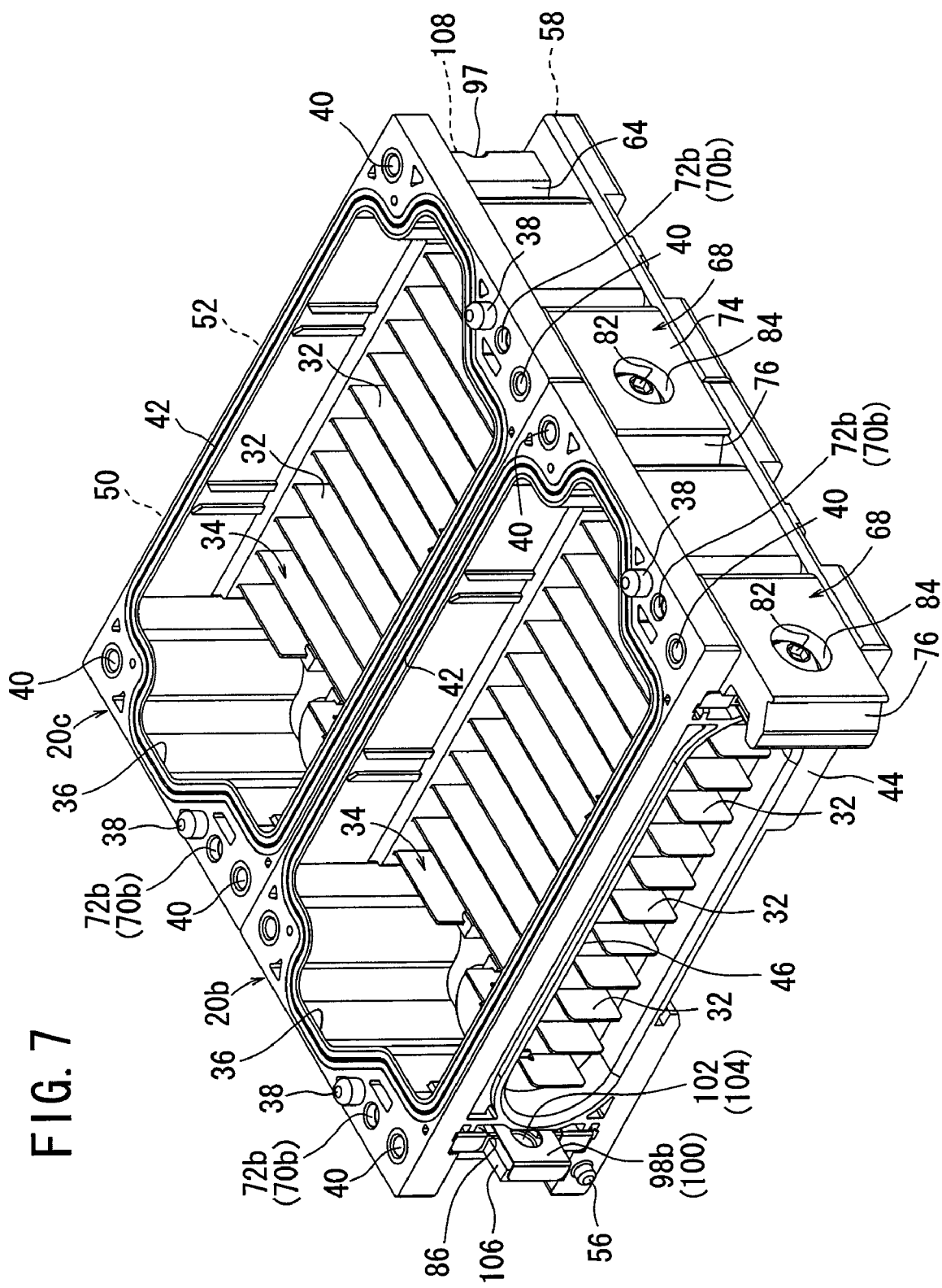
FIG. 7 is a perspective view showing the manner in which adjacent bases are joined to each other.

Thereafter, the screws 82, which are inserted through the screw insertion holes 84 in the connecting members 68, are threaded into the internally threaded holes 104 of the square nuts 106. The first protruding end fingers 76 of the connecting members 68 thereby are retained within the third and fourth recesses 64, 66 of the base 20b. As shown in FIG. 7, the base 20c is then joined to the base 20b. In FIG. 7, the base 20a and the connecting member 68 in the second recess 62 have been omitted from illustration.

The tip end of the screw 82 ultimately abuts against inner wall surfaces of the first slot 90 and the engaging cavity 108, through the screw insertion hole 102 in the leaf spring 100. Arcuate recesses 94, 96, 97 are defined in portions of the grip 88 and the longitudinal side panels 44, 50 where the screw 82 extends. The arcuate recesses 94, 96, 97 provide clearances around the screw 82, in order to prevent the screw 82 from interfering with the grip 88 and the longitudinal side panels 44, 50.

Similarly, the bases 20d, 20e are successively joined. Then, the connecting members 68 of the end block 18 are retained in the third and fourth recesses 64, 66 of the base 20e, whereupon the base 20e and the end block 18 are joined to each other, thereby completing the signal input/output device 10.

According to the present embodiment, the bases 20a through 20e include connecting members 68, wherein the connecting members 68 of adjacent bases 20a through 20e are retained in predetermined portions with respect to the bases adjacent thereto. Accordingly, the signal input/output units of the signal input/output device 10 are joined together with increased joining strength.

For removing any one of the signal input/output units 16a through 16e, or for adding a new signal input/output unit to the signal input/output units 16a through 16e, the screws 82 of the relevant base or bases are loosened to unlock the connecting members 68 from the third and fourth recesses 64, 66. Since an adhesive is not used to join the bases 20a through 20e, it is quite easy to separate the bases 20a through 20e that are adjacent to each other or to separate the signal input/output units 16a through 16e. The base 20e and the end block 18 can also easily be separated from each other.

Furthermore, since adjacent signal input/output units 16a through 16e can be brought into intimate contact with each other, the signal input/output device 10 can be of a liquid-tight structure. Therefore, the signal input/output device 10 may be used in environments that are subjected to exposure to water or oil droplets.

In the illustrated embodiment, the signal input/output units 16a through 16e are joined or separated while being disposed on the guide rail 12 (see FIG. 1). However, the signal input/output devices 10 may be assembled in places different from the location where the guide rail 12 is positioned, and be placed on the guide rail 12 thereafter.

According to the present embodiment, each of the signal input/output units 16a through 16e has a different function. The switching module 22 of the signal input/output unit 16a includes a switch compartment 112, covered with an openable/closable shield cover 110, and accommodating therein a plurality of switches (not shown). Settings of the switching module 22 can be changed by setting the switches to respective ON/OFF states.

The communication module 24 of the signal input/output unit 16b includes three connection terminals 114a through 114c, which are arranged in a triangular pattern. Cables, not shown, serving as communication lines that are connected to the programmable controller referred to above, are connected respectively to the connection terminals 114a through 114c. The signal input/output unit 16b receives and transmits signals from the programmable controller through cables. Signals received by the communication module 24 are transmitted to other signal input/output units 16a, and 16c through 16e. Signals generated by the signal input/output units 16a, and 16c through 16e are transmitted through the communication module 24 to the programmable controller.

The input module 26 of the signal input/output unit 16c includes a plurality of connection terminals. From among these connection terminals, connection terminals 116a, 116b, for example, are connected to cables, which transmit an output signal from a position detecting sensor (not shown). The output module 28 of the signal input/output unit 16d also has a plurality of connection terminals. From among these connection terminals, connection terminals 118a, 118b, for example, are connected to a switching circuit of an air cylinder (not shown).

The power supply module 30 of the signal input/output unit 16c includes a connection terminal 120, which is connected to a cable that is electrically connected to a power supply (not shown).

Each of the connection terminals 114a through 114c, 116a, 116b, 118a, 118b, and 120 of modules 24, 26, 28, and 30 is of a water-resistant structure. When cables are connected to the connection terminals, the connection terminals are held in a liquid-tight state, thus preventing liquids such as water, oil, or the like from entering between the connection terminals and the cables. Other connection terminals, which are not denoted by reference characters, also possess such a water-resistant structure.

The modules 24, 26, 28, 30 have respective plate insertion holes 122 defined in upper end surfaces thereof. Tag plates, not shown, can be inserted into the respective plate insertion holes 122. The tag plates carry descriptions indicating the functions of the modules 24, 26, 28, 30. For example, the tag plate that is inserted in the plate insertion hole 122 of the power supply module 30 carries a description indicating that the module operates as a "POWER SUPPLY". Such tag plates, with corresponding descriptions, are effective to prevent a worker from wrongly connecting cables to the modules 24, 26, 28, 30 after the bases 20a through 20e and the end block 18 have been joined to construct the signal input/output device 10.

When an output signal from the position detecting sensor is input to the input module 26 of the signal input/output unit 16c, the input module 26 then transmits the output signal to the signal input/output unit 16b, which in turn transmits the output signal to the programmable controller.

In response to the supplied signal, the programmable controller generates a control signal in order to adjust the stroke position of the air cylinder. The control signal is transmitted through the signal input/output unit 16b, and sent from the output module 28 to the air cylinder. As a result, the stroke position of the air cylinder is adjusted.

Although adjustment of the stroke position of the air cylinder has been described above, the signal input/output device 10 may also be used for any of various other control applications. For example, the signal input/output device 10 may be used to adjust an opening of a valve, or to adjust both opening of a valve along with a stroke position of the air cylinder.

Signal input/output units other than the signal input/output units 16a through 16e may be provided. For example, a unit having an analog input module or an analog output module for inputting or outputting analog signals, or a unit having a digital input module or a digital output module for inputting or outputting digital signals, may be added as required to the signal input/output device 10. Of course, any of the signal input/output units may be removed from the signal input/output device 10, so long as desired operations of the signal input/output device are not affected.

Since the signal input/output device 10 allows the user to add or remove signal input/output units depending on the purpose for which the signal input/output device 10 is to be used, it is easy to add or remove signal input/output units, and to change the number of connection terminals, by incorporating a module having a different number of connection terminals. Further, modules can be combined having different numbers of connection terminals, and the order in which the signal input/output units are arrayed can easily be changed. Stated otherwise, the signal input/output device 10 can be handled conveniently.

Inasmuch as the signal input/output units 16a through 16e are integrally joined together by connectors 34, the number of wires used in the signal input/output device 10 is greatly reduced. The signal input/output device 10 is thus simplified in structure and reduced in size, and can easily be serviced for maintenance. Moreover, the signal input/output device 10 can be manufactured at a reduced cost.

The leaf springs 100 may be dispensed with, and the screws 82 may be secured in place using only the square nuts 106.

Although a certain preferred embodiment of the present invention has been shown and described in detail, it should be understood that various changes and modifications may be made to the embodiment without departing from the scope of the invention as set forth in the appended claims.

What is claimed is:

1. A signal input/output device comprising:
    an array of signal input/output units, each of said signal input/output units comprising a base having a connector, and an electric signal input/output module disposed on said base;
    said base comprising a connecting member swingably supported about a swing shaft on one end of said base and a stop disposed at an opposite end of said base for engaging a connecting member of another base that is disposed adjacent to said base, said connecting member having a shaft insertion hole therein through which said swing shaft is inserted such that said connecting member is swingable with respect to said base about said swing shaft,
    wherein adjacent signal input/output units are joined to each other by said connecting member of said base, which engages in a stop of said another base that is disposed adjacent to said base, and
    wherein said connecting member is swingable with respect to said base in a disconnected state, when said signal input/output units are not joined to each other.

2. A signal input/output device according to claim 1, wherein said connecting member of said base is secured to an engaging portion of said base by a fastening member.

3. A signal input/output device according to claim 2, wherein said base and said another base that is disposed adjacent to said base have cavities defined respectively therein, said engaging portion comprising a retainer inserted into both of said cavities.

4. A signal input/output device according to claim 3, further comprising a resilient member supporting said retainer to prevent removal thereof.

5. A signal input/output device according to claim 4, wherein said base and said another base that is disposed adjacent to said base have cavities defined respectively therein, said resilient member being inserted into both of said cavities.

6. A signal input/output device according to claim 1, further comprising:
  an end block disposed adjacent to one of said signal input/output units at an end of said array;
  said end block comprising a connecting member swingably supported on an end thereof, which faces said one signal input/output unit;
  wherein said connecting member of said end block engages in a stop of said one of said signal input/output units.

7. A signal input/output device according to claim 1, wherein said electric signal input/output module has an insertion hole for insertion of a tag plate therein.

8. A signal input/output device according to claim 1, wherein said connecting member is of a substantially concave shape and has a bottom plate with a first protruding end finger and a second protruding end finger disposed on respective opposite ends of said bottom plate, said first protruding end finger engaging said stop of said another base, and said second protruding end finger being swingably supported on said base by said swing shaft.

9. A signal input/output device according to claim 1, wherein said base has at least one of an engaging hole and an engaging pin, and said another base that is disposed adjacent to said base has at least one of an engaging pin and an engaging hole, said engaging pin being fitted into said engaging hole.

10. A signal input/output device according to claim 1, further comprising a guide member for guiding said bases of the signal input/output units for movement toward or away from each other.

11. A signal input/output device according to claim 1, wherein said shaft insertion hole is non-circular and elongated in cross section, such that said connecting member is both slidable and swingably supported with respect to said swing shaft.

12. A signal input/output device comprising:
  an array of signal input/output units, each of said signal input/output units comprising a base having a connector, and an electric signal input/output module disposed on said base;
  said base comprising a connecting member swingably supported about a swing shaft on one end of said base and a stop disposed at an opposite end of said base for engaging a connecting member of another base that is disposed adjacent to said base, said connecting member having a shaft insertion hole therein through which said swing shaft is inserted such that said connecting member is swingable with respect to said base about said swing shaft;
  said connecting member being of a substantially concave shape and having a bottom plate with a first protruding end finger and a second protruding end finger disposed on respective opposite ends of said bottom plate;
  said first protruding end finger engaging said stop of said another base, and said second protruding end finger being swingably supported on said base by said swing shaft;
  and said second protruding end finger engaging said stop of said another base, thereby joining adjacent signal input/output units to each other,
  wherein said connecting member is swingable with respect to said base in a disconnected state, when said signal input/output units are not joined to each other.

13. A signal input/output device according to claim 12, wherein said base and said another base that is disposed adjacent to said base have cavities defined respectively therein, and further comprising a retainer inserted into both of said cavities, wherein said bottom plate is secured to said retainer by a fastening member.

14. A signal input/output device according to claim 13, further comprising a resilient member supporting said retainer to prevent removal thereof.

15. A signal input/output device according to claim 14, wherein said base and said another base that is disposed adjacent to said base have cavities defined respectively therein, said resilient member being inserted into both of said cavities.

16. A signal input/output device according to claim 12, wherein said base has at least one of an engaging hole and an engaging pin, and said another base that is disposed adjacent to said base has at least one of an engaging pin and an engaging hole, said engaging pin being fitted into said engaging hole.

17. A signal input/output device according to claim 12, wherein said shaft insertion hole is non-circular and elongated in cross section, such that said connecting member is both slidable and swingably supported with respect to said swing shaft.

* * * * *